United States Patent [19]
Ikeda et al.

[11] Patent Number: 5,676,757
[45] Date of Patent: *Oct. 14, 1997

[54] DECOMPRESSION CONTAINER

[75] Inventors: Towl Ikeda, Yamanashi-Ken; Katsumi Ishii, Kanagawa-Ken; Yoji Iizuka, Tokyo-to, all of Japan

[73] Assignee: Tokyo Electron Limited, Tokyo-to, Japan

[*] Notice: The term of this patent shall not extend beyond the expiration date of Pat. No. 5,520,142.

[21] Appl. No.: 628,016

[22] Filed: Apr. 4, 1996

Related U.S. Application Data

[63] Continuation-in-part of Ser. No. 409,427, Mar. 24, 1995, Pat. No. 5,520,142.

[30] Foreign Application Priority Data

Mar. 28, 1994 [JP] Japan ................... 6-080882

[51] Int. Cl.⁶ .................................................. C23C 16/00
[52] U.S. Cl. ........................... 118/733; 118/50; 220/681
[58] Field of Search .......................... 118/715, 723 E, 118/733, 50; 156/345; 204/298.01, 298.02, 298.31; 220/677, 681, 692

[56] References Cited

U.S. PATENT DOCUMENTS

| | | | |
|---|---|---|---|
| 4,133,442 | 1/1979 | Wiltshire | 220/5 R |
| 4,418,646 | 12/1983 | Zajac | 118/733 |
| 4,539,062 | 9/1985 | Zajac | 156/345 |
| 4,640,223 | 2/1987 | Dozier | 118/719 |
| 4,641,603 | 2/1987 | Miyazaki | 118/724 |
| 5,072,851 | 12/1991 | Wilkes | 220/366 |
| 5,096,536 | 3/1992 | Cathey | 156/643 |
| 5,133,986 | 7/1992 | Blum | 427/39 |
| 5,198,724 | 3/1993 | Konuma | 315/111.21 |
| 5,223,001 | 6/1993 | Saeki | 29/25.01 |
| 5,367,139 | 11/1994 | Bennett | 219/121.59 |
| 5,429,704 | 7/1995 | Butler | 156/345 |
| 5,498,291 | 3/1996 | Arnold | 118/723 E |
| 5,520,142 | 5/1996 | Ikeda | 118/733 |

FOREIGN PATENT DOCUMENTS

| | | | |
|---|---|---|---|
| 34669 | 3/1977 | Japan | 118/733 |
| 193463 | 8/1989 | Japan | 118/733 |
| 126694 | 5/1991 | Japan | 118/733 |
| 100533 | 4/1992 | Japan | 118/733 |

*Primary Examiner*—Richard Bueker
*Assistant Examiner*—Jeffrie R. Lund
*Attorney, Agent, or Firm*—Beveridge, DeGrandi Weilacher & Young, LLP

[57] ABSTRACT

There is a gap between the respective inner regions of the end face of the cylindrical side wall and the abutting portion of the top plate, which are situated inside the seal member. Even though the top plate is bent inward by atmospheric pressure when the container is decompressed to a predetermined degree of vacuum, therefore, the abutting portion thereof cannot come into contact with the inner edge of the end face of the cylindrical side wall. Thus, if decompression and exposure to atmospheric pressure are repeated to bend the cylindrical side wall repeatedly, there is no possibility of the inner edge portion of the end face of the cylindrical side wall being separated or rubbed off to produce dust. Moreover, the cylindrical side wall and top plate are joined together in the region outside the seal member. If dust is produced by the contact between the cylindrical side wall and top plate at their junctions outside the seal member, therefore, it is prevented from entering the container by the seal member. Thus, a clean atmosphere in the container cannot be contaminated by the dust.

2 Claims, 4 Drawing Sheets

DECOMPRESSION CONTAINER

CROSS-REFERENCE TO RELATED APPLICATION

This application is a continuation-in-part of U.S. patent application Ser. No. 08/409,427, filed Mar. 24, 1995, now U.S. Pat. No. 5,520,142.

BACKGROUND OF THE INVENTION

1. Field of the Invention

The present invention relates to a decompression container, such as a treatment container and a vacuum reserve chamber, of which a top plate and a side wall produce no dust despite repeated decompression.

2. Information of the Related Art

Treatment containers of various treatment apparatuses, such as film forming apparatuses, etching apparatuses, etc., which are used in a semiconductor device manufacturing process, are closed airtightly so that a treatment chamber therein can be decompressed to a predetermined degree of vacuum, e.g., $10^{-6}$ to $10^{-7}$ torr. After a semiconductor wafer (hereinafter referred to simply as wafer) for use as an object to be treated is placed on, for example, a mount in the treatment chamber, it is subjected to a predetermined treatment under a reduced pressure in each apparatus.

In order to shorten the decompression time to improve the throughput or prevent involvement of dust from the atmosphere, many of the treatment containers are coupled with a vacuum reserve chamber called a load locking chamber by means of a gate valve. The reserve chamber is adjusted to a degree of vacuum (e.g., $10^{-2}$ torr) lower than that of the treatment container. After the to-be-treated object is temporarily delivered into the vacuum reserve chamber, it is carried into the treatment chamber when the two chambers are equalized in the degree of vacuum.

Thus, the treatment container or the vacuum reserve chamber is evacuated to a predetermined degree of decompression. Accordingly, junctions between a top plate, side plate, and bottom plate of the container or chamber require a high degree of airtightness. One such junction of a conventional decompression container of this type is constructed in the manner shown in FIG. 5, for example.

FIG. 5 shows the way a top plate 101, which is formed of an aluminum plate material treated with anodized aluminum, and a side wall 102 of the same material are joined together. A groove 103 is formed in the upper end face of the side wall 102, and an O-ring 104 for use as a seal member is fitted in the groove 103 so that its top portion projects from the groove. The upper end face of the side wall 102 is joined close to the lower surface of the peripheral edge portion of the top plate 101, and a clamping member 105 such as a bolt, which is located outside the O-ring 104, is screwed into the upper end face of the side wall 102 from above the top plate 102. Thus, the top plate 101 and the side wall 102 are coupled together.

As mentioned before, the treatment container of this type is evacuated to a high degree of vacuum, e.g., $10^{-6}$ to $10^{-7}$ torr or $10^{-2}$ torr. When the container is decompressed, therefore, the top plate 101, for example, is subjected to a very high pressure attributable to atmospheric pressure, as indicated by the arrow in FIG. 5. Thus, even in the case of a conventional treatment container of the same aluminum material for wafer treatment, the top plate 101 is bound to bend downward. In the case of a top plate with a radius of about 300 mm and a thickness of 30 mm, for example, a maximum deflection d in its central portion attains more than 0.25 mm. In this case, the starting point of deflection lies on an inner corner edge portion 102a of the side wall 102.

As mentioned before, moreover, the treatment container or the vacuum reserve chamber is repeatedly decompressed or restored with every treatment of the to-be-treated object. In a sheet treatment apparatus which pursues a particularly high throughput, the decompression and restoration are repeated many times an hour, depending on the type of the treatment. The top plate 101 bends in the manner shown in FIG. 6 with every decompression. Thus, when the top plate 101 is restored to its original state, the deflection is reduced. In the case of the vacuum reserve chamber, in particular, the top plate 101 is brought to a horizontal state, as shown in FIG. 5, when exposed to the atmospheric pressure.

As the change of the deflection of the top plate 101 is repeated in this manner, the corner edge portion 102a of the side wall 102 may be separated or rubbed off, as shown in FIG. 7, so that particles of aluminum which forms the side wall 102 inevitably scatter and contaminate the interior of the container.

As is generally known, semiconductor devices must be treated in a very clean atmosphere, so that their yield will be lowered if they are contaminated by the metal particles in the aforesaid manner.

SUMMARY OF THE INVENTION

The object of the present invention is to provide a decompression container of which a top plate and a side wall produce no dust despite repeated decompression.

According to one aspect of the present invention, there is provided a decompression container capable of being decompressed inside, comprising:

a cylindrical side wall having an end face and a groove therein;

a top plate having an abutting portion abutting against the end face of the cylindrical side wall; and a seal member adapted to be fitted in the groove and pressed against the abutting portion of the top plate, wherein an end face of the cylindrical side wall has a substantially flat form before the interior of the container is decompressed, and an inner region of the abutting portion of the top plate has a step different in level from the outer region of the abutting portion, whereby a gap is defined between the respective inner regions of the end face of the cylindrical side wall and the abutting portion of the top plate.

In this arrangement, there is the gap between the respective inner regions of the end face of the cylindrical side wall and the abutting portion of the top plate, which are situated inside the seal member. Even though the top plate is bent inward by atmospheric pressure when the container is decompressed to a predetermined degree of vacuum, therefore, the abutting portion thereof cannot come into contact with the inner edge of the end face of the cylindrical side wall.

Thus, if decompression and exposure to atmospheric pressure are repeated to bend the cylindrical side wall repeatedly, there is no possibility of the inner edge portion of the end face of the cylindrical side wall being separated or rubbed off to produce dust.

Moreover, the cylindrical side wall and top plate are joined together in the region outside the seal member. If dust is produced by the contact between the cylindrical side wall and top plate at their junctions outside the seal member, therefore, it is prevented from entering the container by the seal member. Thus, a clean atmosphere in the container cannot be contaminated by the dust.

According to another aspect of the present invention, there is provided a decompression container capable of being decompressed inside, comprising:

a cylindrical side wall having an end face and a groove therein;

a top plate having an abutting portion abutting against the end face of the cylindrical side wall; and a seal member adapted to be fitted in the groove and pressed against the abutting portion of the top plate, wherein an end face of the cylindrical side wall has a substantially flat form before the interior of the container is decompressed, and an inner region of the abutting portion of the top plate has a step different in level from the outer region of the abutting portion, whereby the respective inner regions of the end face of the cylindrical side wall and the abutting portion of the top plate, which are situated inside the seal member, are prevented from coming into contact with each other when the interior of the container is decompressed.

In this arrangement, the respective inner regions of the end face of the cylindrical side wall and the abutting portion of the top plate, which are situated inside the seal member, are prevented from coming into contact with each other when the interior of the container is decompressed. Thus, if decompression and exposure to atmospheric pressure are repeated to bend the top plate repeatedly, there is no possibility of the inner edge portion of the end face of the cylindrical side wall being separated or rubbed off to produce dust. Moreover, the cylindrical side wall and top plate are joined together in the region outside the seal member. If dust is produced by the contact between the cylindrical side wall and top plate at their junction outside the seal member, therefore, it is prevented from entering the container by the seal member. Thus, a clean atmosphere in the container cannot be contaminated by the dust.

DETAILED DESCRIPTION OF THE PREFERRED EMBODIMENTS

Preferred embodiments of the present invention will become understood from the following detailed description referring to the accompanying drawings.

Figure 1:
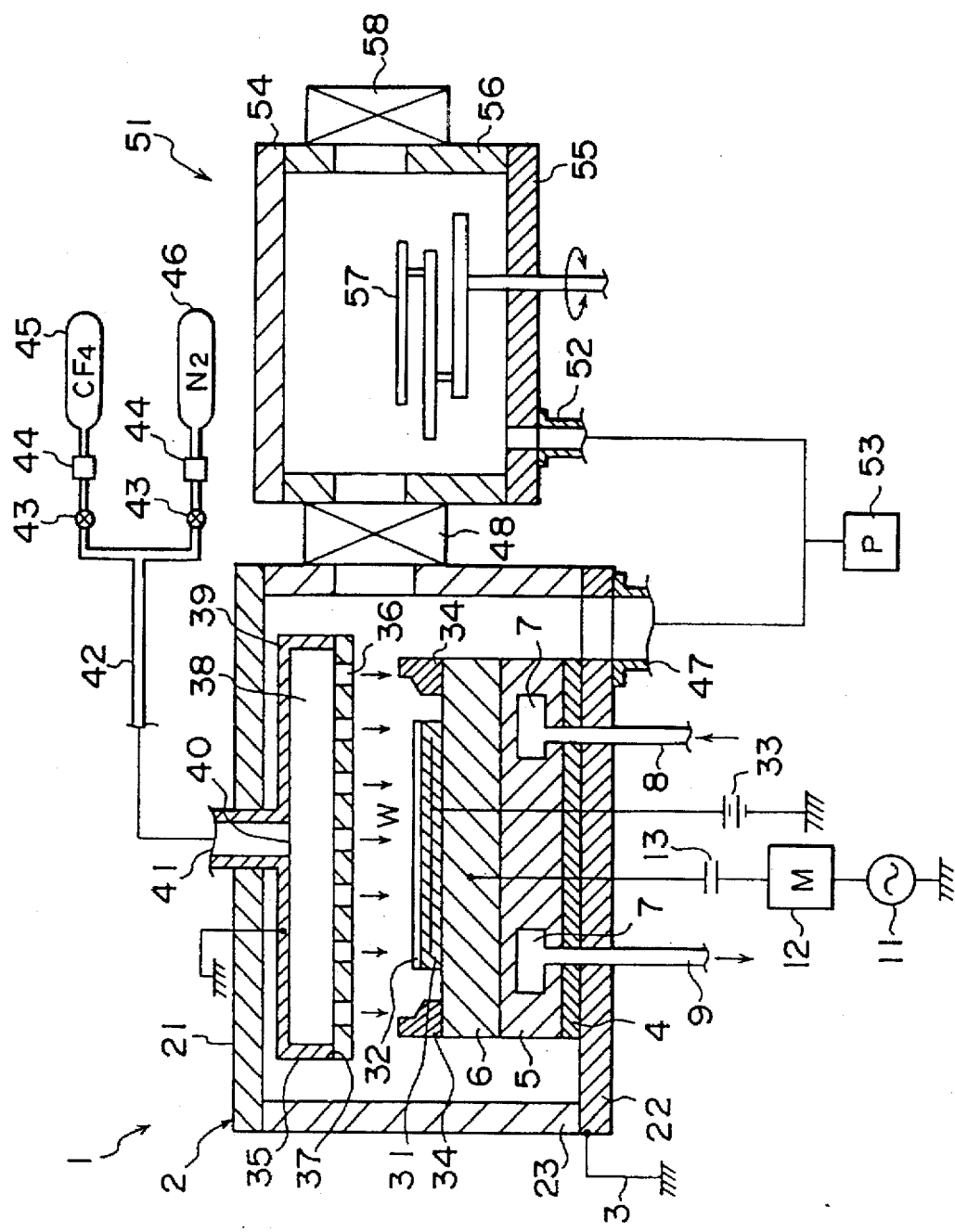
FIG. 1 is a sectional side view of a plasma etching apparatus to which an embodiment of the present invention is applied.

FIG. 1 is a schematic sectional view of a plasma etching apparatus 1 which employs a decompression container according to an embodiment of the present invention. The plasma etching apparatus 1 is constructed as an RIE apparatus of the so-called parallel-plate type in which electrode plates are opposed parallel to each other.

In connection with the present embodiment, a case of etching a silicon oxide film ($SiO_2$) on a wafer W, which has a silicon substrate, will be described.

The plasma etching apparatus 1 comprises a cylindrical treatment container 2 of aluminum or stainless steel whose surface is treated with anodized aluminum, for example. The container 2 is grounded by means of a ground wire 3. The present invention is first applied to this treatment container 2, which is composed of container members such as a substantially disk-shaped top plate 21 (second container member), a substantially disk-shaped bottom plate 22, and a substantially cylindrical side wall 23 (first container member) whose upper and lower end faces are fixedly joined to the top and bottom plates 21 and 22, respectively.

Figure 2:
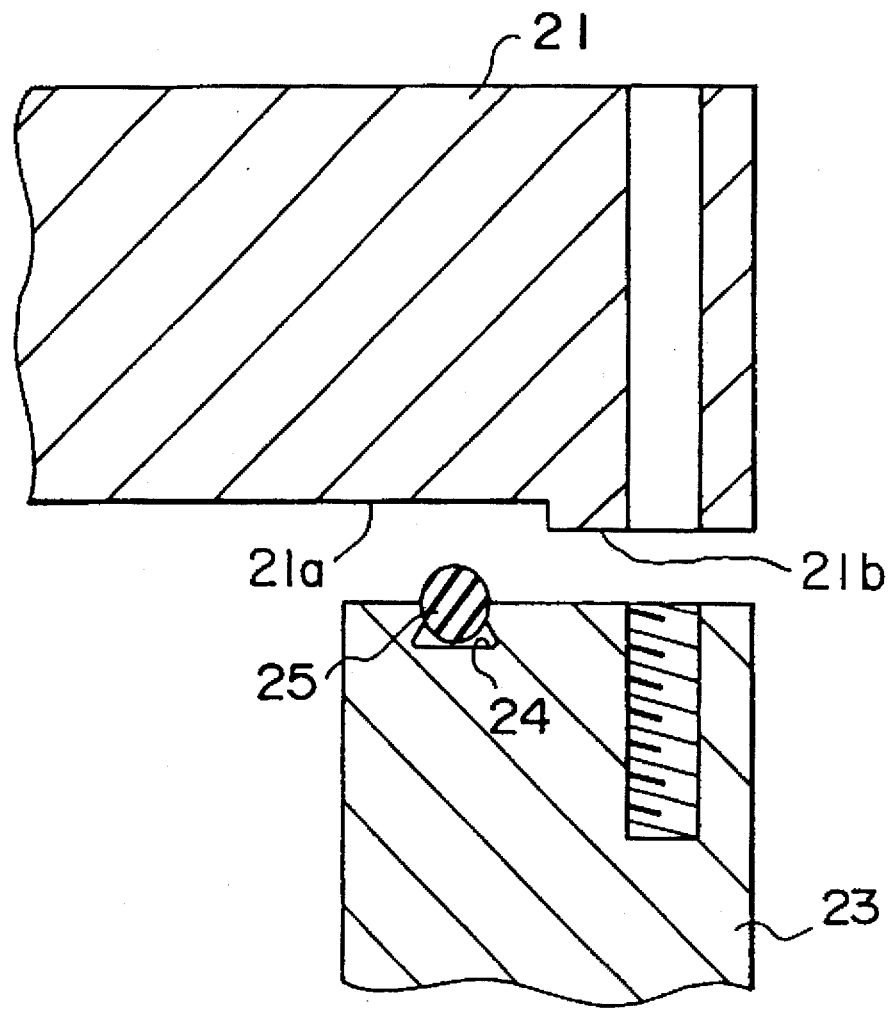
FIG. 2 is a sectional view showing a state before a top plate and a side wall of a treatment container of the plasma etching apparatus of FIG. 1 are joined together.
Figure 3:
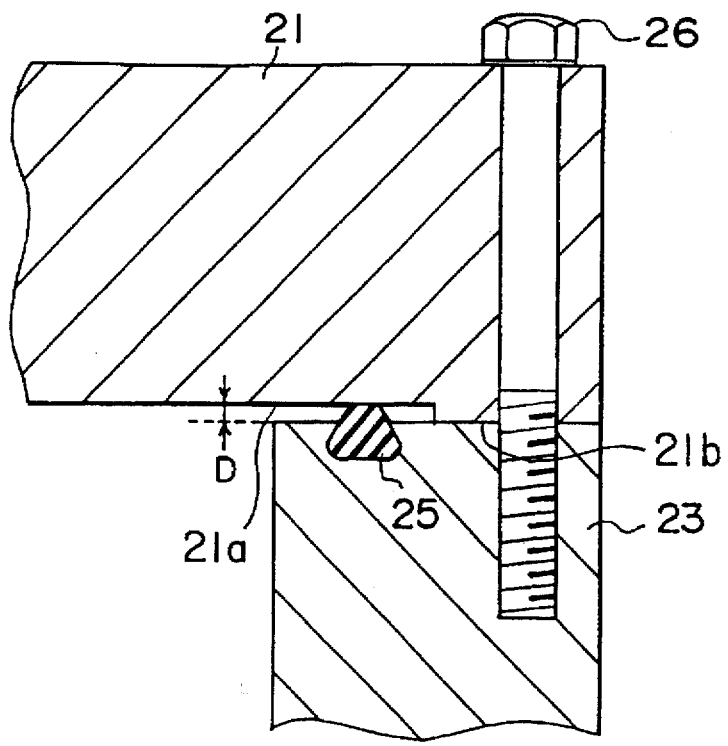
FIG. 3 is a sectional view showing a state in which the top plate and the side wall of the treatment container of the plasma etching apparatus of FIG. 1 are joined together.

Referring to FIGS. 2 and 3, an annular groove 24 is formed in the upper end face of the side wall 23, and an O-ring 25 of e.g. fluororubber, for use as a seal member, is fitted in the groove 24 so that its top portion projects from the groove. It is to be understood that the material of the O-ring 25 is not limited to fluororubber, and may be any other suitable material such as silicone rubber. Moreover, the seal member itself is not limited to the O-ring, and may be formed of a metallic C-ring, for example. In the present embodiment, part of the O-ring 25 is exposed directly to a plasma. In consideration of the plasma resistance, VITON rubber or CHEMRAG elastomeric material is available as a preferred specific example of the O-ring 25. KALREZ elastomeric material (trademark) is a further preferable example with higher plasma resistance.

An inner face portion 21a of the top plate 21 is formed on a level higher than that of the outer end face portion 21b. In this manner, a gap D is secured between the inner face portion 21a of the top plate 21 and the upper end face of the side wall 23. Therefore, the inner face portion 21a of the top plate 21 and the end face of the side wall 23 are prevented from coming into contact with each other in the region inside the seal member 25 when the container is decompressed inside.

The groove 24 has a depth of, e.g., about 3 mm, and the O-ring 25 projects about 1 mm from the groove 24 when the top plate 21 is not pressed. When the top plate 21 is pressed, the O-ring 25 is deformed and housed entire in the groove 24. In this case, the size of the gap D may be settled depending on the deflection of the top plate 21 in a decompressed state, in consideration of the size, thickness, and material of the top plate 21, the thickness and material of the side wall 23, and the degree of decompression in the treatment container 2, and is adjusted to 0.1 mm to 0.2 mm.

Moreover, the inner face portion 21a inside the groove 24 may be made higher in level than the outer end face portion 21b by, for example, shaving away the inner face 21a or forming the step for the outer end face portion 21b previously with, so to speak, a step or a difference in level corresponding to the gap D.

The side wall 23 and the top plate 21 fabricated in this manner are brought intimately into contact with each other, as shown in FIG. 3, and are fixedly joined together by means of a clamping member 26 such as a bolt. Thus, the top plate 21 and the side wall 23 can be separated from each other by loosening the clamping member 26.

A substantially cylindrical susceptor support 5 for carrying a to-be-treated object, e.g., a semiconductor wafer (hereinafter referred to simply as wafer) W, is placed on an insulator plate 4 of ceramics or the like which is mounted at the bottom of a treatment chamber in the treatment container 2. Further, a susceptor 6, which constitutes a lower electrode, is located on top of the susceptor support 5.

A refrigerant chamber 7 is defined in the susceptor support 5, and a refrigerant for temperature regulation, such as liquid nitrogen, can be introduced into the chamber 7 through a refrigerant inlet pipe 8. The introduced refrigerant circulates in the refrigerant chamber 7, thereby cooling the susceptor 6 and the wafer W to a desired temperature.

In the aforesaid case where liquid nitrogen is used as the refrigerant, for example, nitrogen gas generated by its nuclear boiling is discharged from the treatment container 2 through a refrigerant outlet pipe 9.

The output side of a high-frequency power source 11, which is located outside the treatment container 2, is connected to the susceptor 6 through a blocking capacitor 12 and a matching box 13 by means of a feeder rod 14, and is supplied with high-frequency power at a frequency of, e.g., 13.56 MHz.

The central portion of the upper surface of the susceptor 6 is in the form of a convex disk, and carries thereon an electrostatic chuck 31 which has substantially the same shape as the wafer W. The chuck 31 is composed of a conductive layer 32 sandwiched between two high-molecular polyimide films. As the conductive layer 32 is supplied with a high DC voltage of e.g. 1.5 kV from a DC high-voltage source 33 which is located outside the treatment container 2, the wafer W on the upper surface of the electrostatic chuck 31 is held in position by attraction by means of a Coulomb force.

A focus ring 34 is provided on the peripheral edge portion of the upper end of the susceptor 6 so as to surround the wafer W which is placed on the electrostatic chuck 31. The ring 34 is formed of an insulating material which cannot attract reactive ions, and is designed so as to cause reactive ions generated by a plasma to be effectively incident upon only the wafer W inside itself.

An upper electrode 35 overlies the susceptor 6 so as to face it in parallel relation at a distance of about 5 to 20 mm therefrom. The electrode 35 is supported by the top plate 21 of the treatment container 2.

The upper electrode 35 includes an electrode plate 37 of e.g. SiC or amorphous carbon, which has a large number of diffusion holes 36 in its susceptor-side face, and a supporting plate 39 of aluminum whose surface is treated with, for example, anodized aluminum. The supporting plate 39 is situated parallel to the electrode plate 37 in a manner such that a hollow portion 38 is defined between the two plates.

A gas inlet port 40 is formed in the center of the supporting plate 39 of the upper electrode 35, and a gas inlet pipe 41 is connected to the port 40.

A gas supply pipe 42 is connected to the gas inlet pipe 41. The pipe 42 is divided into two branches, which communicate with their corresponding treatment gas sources 45 and 46 via valves 43 and mass flow controllers 44, individually.

In the present embodiment, $CF_4$ gas is supplied from the treatment gas source 45, and $N_2$ gas, an inert purge gas, from the treatment gas source 46.

An exhaust pipe 47 is connected to the lower portion of the treatment container 2. The pipe 47, along with an exhaust pipe 52 of a load locking chamber 51 which is connected to the container 2 by means of a gate valve 48, communicates with exhaust means 53, such as a turbine molecular pump, and can be evacuated to a predetermined degree of decompression.

The load locking chamber 51, like the treatment container 2, is composed of a top plate 54, a bottom plate 55, and a side wall 56 whose upper and lower joint end faces are joined to the inner surfaces of the top and bottom plates 54 and 55, respectively. The respective surfaces of these plates are treated with anodized aluminum.

The upper end face of the side wall 56 and the top plate 54, like the side wall 23 and the top plate 21 of the treatment container 2, are airtightly joined to each other with a gap formed in the region inside a seal member.

Transportation means 57, such as a transportation arm, is provided in the load locking chamber 51, and the wafer W, a to-be-treated object, is delivered between the treatment container 2 and the chamber 51 by the transportation means 57. Another gate valve 58 is attached to the side wall 56 of the load locking chamber 51, in a position opposite the aforesaid gate valve 48. The valve 58 connects the chamber 51 and a cassette chamber (not shown) which receives wafer cassettes (not shown) each containing a set of wafers W.

The following is a description of the operation of the plasma etching apparatus 1 according to the present embodiment constructed in the aforementioned manner. After the gate valve 58 is opened, the wafer W, a to-be-treated object, is first temporarily delivered from the cassette chamber into the load locking chamber 51 by the transportation means 57. After the valve 58 is closed, the load locking chamber 51 is evacuated to a predetermined degree of decompression, e.g., $10^{-2}$ torr by the exhaust means 53.

Then, after the gate valve 48 is opened, the wafer W is delivered from the load locking chamber 51 into the treatment container 2, and is placed on the electrostatic chuck 31. Thereupon, the wafer W is held on the chuck 31 by attraction as it is supplied with voltage from the DC high-voltage source 33. After the transportation means 57 recedes into the load locking chamber 51, thereafter, the treatment container 2 is evacuated to a predetermined degree of decompression, e.g., $10^{-3}$ torr by the exhaust means 53.

On the other hand, the valves 43 are opened, and the $CF_4$ gas, an etching reaction gas, from the treatment gas source 45 is introduced into the hollow portion 38 of the upper electrode 35 through the gas supply pipe 42, gas inlet pipe 41, and gas inlet port 40 in a manner such that its flow rate adjusted by its corresponding mass flow controller 44. Then, the $CF_4$ gas is evenly discharged from the hollow portion 38 toward the wafer W through the diffusion holes 36, and predetermined high-frequency power from the high-frequency power source 11 is applied to the susceptor 6. Thereupon, a plasma is generated between the upper electrode 35 and the susceptor 6, and the wafer W is subjected to a predetermined etching process by means of radical components which are produced as a result of dissociation of the introduced $CF_4$ gas.

When the predetermined etching process is finished, the degree of decompression in the treatment container 2 is temporarily lowered to $10^{-2}$ torr, the same level as the decompression degree of the load locking chamber 51. Thereafter, the gate valve 48 is opened, and the treated wafer W is carried out into the load locking chamber 51. After the gate valve 48 is closed, the degree of decompression of the load locking chamber 51 is lowered to the same level as the adjacent cassette chamber, e.g., $10^{-1}$ torr. Thereafter, the gate valve 58 is opened, and the treated wafer W is carried out into the cassette chamber by the transportation means 57.

Thus, the treatment container 2 and the load locking chamber 51 are decompressed with every treatment of the wafer W. Under reduced pressure, the top plates 21 and 54 are bent downward by atmospheric pressure.

Figure 4:
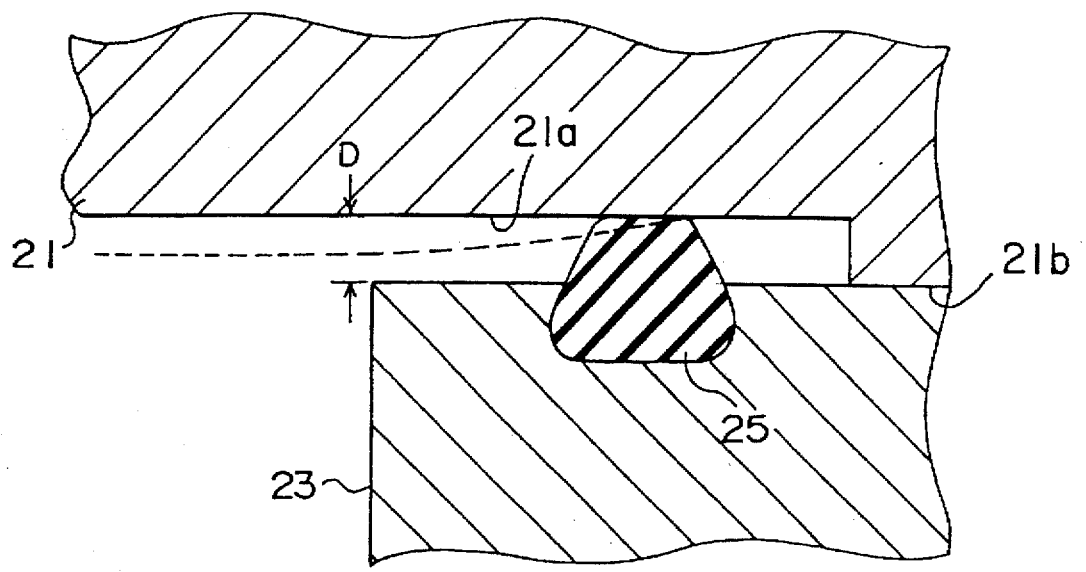
FIG. 4 is an enlarged sectional view corresponding to FIG. 2 for illustrating the function of the embodiment.
Figure 5:
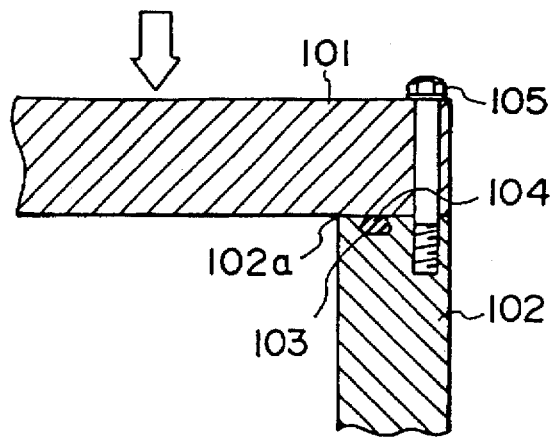
FIG. 5 is a sectional view showing a state in which a top plate and a side wall of a prior art decompression container are joined together.
Figure 6:
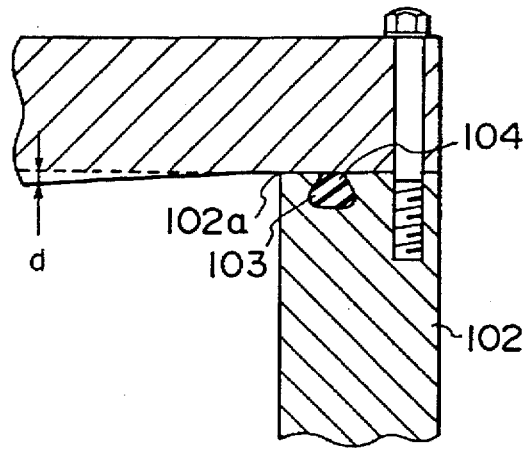
FIG. 6 is a sectional view showing a state in which the top plate of FIG. 5 is bent when the container is decompressed.
Figure 7:
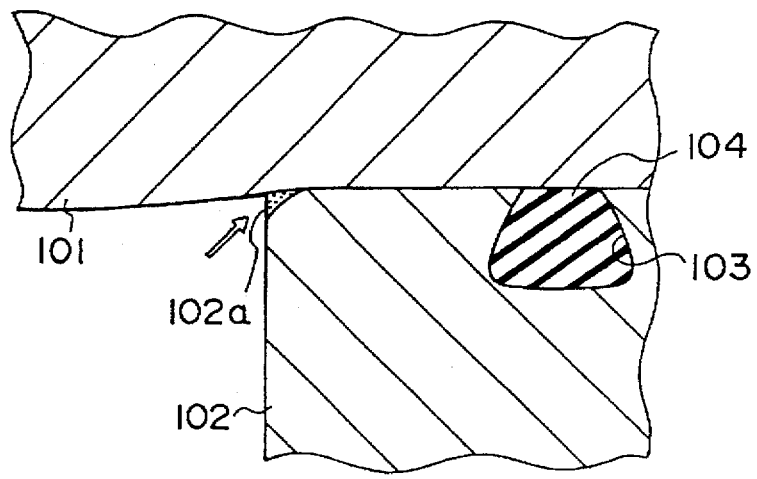
FIG. 7 is an enlarged sectional view showing a state in which the inner edge portion of the upper end face of the side wall of FIG. 5 is rubbed off.

As mentioned before, however, the inner face portion 21a of the top plate 21 is higher than the outer face portion 21b, and the gap D is secured between the inner face portion 21b of the top plate 21 and the end face of the side wall 23. Even when the top plate 21 is bent in the manner indicated by broken line in FIG. 4, therefore, the inner face portion 21b of the top plate 21 and the end face of the side wall 23 can never come into contact with each other.

Thus, even though the treatment container 2 is decompressed repeatedly, there is no possibility of dust being produced by the contact between the inner surface of the top plate 21 and the end face portion of the side wall 23, so that a clean atmosphere in the treatment container 2 cannot be contaminated by dust.

Since the top plate 54 and the side wall 56 of the load locking chamber 51 are joined to each other in the same manner as the top plate 21 and the side wall 23 of the treatment container 2, moreover, dust cannot be produced in the load locking chamber 51 by contact between the inner surface of the top plate 54 and the upper joint end face of the side wall 56.

Thus, the wafer W etched in the plasma etching apparatus 1 cannot be contaminated due to causes attributable to the treatment container 2 and the load locking chamber 51 themselves, so that the yield can be improved.

Although the present invention is applied to the joining between a top plate and a side wall according to the embodiments described herein, it is to be understood that the invention may be also applied to the joining between a bottom plate and a side wall or between side walls.

The present invention can be carried out by only shaving away that portion of the upper end face of a side wall which is situated inside a seal member, so that it can be easily applied to existing decompression containers in operation.

Although the foregoing embodiments are applied to plasma etching apparatuses, the present invention is not limited to these embodiments, and may be applied to treatment containers of any other suitable treatment apparatuses, such as heat treatment apparatuses, sputtering apparatuses, and CVD apparatuses, and various decompression containers, such as load locking chambers, cassette chambers, robot chambers, etc., which are attached to these apparatuses. It is to be understood that these treatment apparatuses are not limited to the service for semiconductor wafers, and may be also used for the treatment of LCD substrates, for example.

Further, the word "cylindrical" of the cylindrical side wall is not limited to a shape of circle and may be directed to a shape of rectangular or square, or the like.

While the presently preferred embodiments of the present invention have been shown and described, it is to be understood that this disclosure is for the purpose of illustration and that various changes and modifications may be made without departing from the scope of the invention as set forth in the appended claims.

What is claimed is:

1. A decompression container capable of being decompressed inside, comprising:

a cylindrical side wall having an end face and a groove therein;

a top plate having an abutting portion abutting against the end face of the cylindrical side wall; and a seal member adapted to be fitted in the groove and pressed against the abutting portion of the top plate, wherein an end face of the cylindrical side wall has a substantially flat form before the interior of the container is decompressed, and an inner region of the abutting portion of the top plate has a step difference in level from the outer region of the abutting portion, whereby a gap is defined between the respective inner regions of the end face of the cylindrical side wall and the abutting portion of the top plate.

2. A decompression container capable of being decompressed inside, comprising:

a cylindrical side wall having an end face and a groove therein;

a top plate having an abutting portion abutting against the end face of the cylindrical side wall; and a seal member adapted to be fitted in the groove and pressed against the abutting portion of the top plate, wherein an end face of the cylindrical side wall has a substantially flat form before the interior of the container is decompressed, and an inner region of the abutting portion of the top plate has a step difference in level from the outer region of the abutting portion, whereby the respective inner regions of the end face of the cylindrical side wall and the abutting portion of the top plate, which are situated inside the seal member, are prevented from coming into contact with each other when the interior of the container is decompressed.

* * * * *